United States Patent
Lee et al.

(10) Patent No.: US 7,960,732 B2
(45) Date of Patent: Jun. 14, 2011

(54) THIN FILM TRANSISTOR ARRAY PANEL AND MANUFACTURING METHOD THEREOF

(75) Inventors: Jeong-Young Lee, Yongin (KR); Se-Hwan Yu, Seoul (KR); Sang-Jin Jeon, Seoul (KR); Min-Wook Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 680 days.

(21) Appl. No.: 12/082,495

(22) Filed: Apr. 11, 2008

(65) Prior Publication Data

US 2008/0191212 A1  Aug. 14, 2008

Related U.S. Application Data

(60) Continuation of application No. 11/395,434, filed on Mar. 30, 2006, now Pat. No. 7,358,123, which is a division of application No. 10/884,083, filed on Jul. 1, 2004, now Pat. No. 7,023,016.

(30) Foreign Application Priority Data

Jul. 2, 2003 (KR) ........................ 10-2003-0044581
Aug. 11, 2003 (KR) ........................ 10-2003-0055415
Aug. 11, 2003 (KR) ........................ 10-2003-0055416

(51) Int. Cl.
*H01L 29/04* (2006.01)
(52) U.S. Cl. .......................................... 257/59; 438/149
(58) Field of Classification Search ............. 257/59, 257/72, E29.273; 438/30, 149, 151, 608, 438/609; 349/43
See application file for complete search history.

(56) References Cited

U.S. PATENT DOCUMENTS

| | | | |
|---|---|---|---|
| 4,904,056 A | 2/1990 | Castleberry | |
| 5,905,549 A | 5/1999 | Lee | |
| 5,926,235 A | 7/1999 | Han et al. | |
| 6,888,586 B2 * | 5/2005 | Yoo et al. | 349/43 |
| 6,972,822 B2 * | 12/2005 | Miyashita | 349/156 |
| 2001/0032981 A1 | 10/2001 | Kong et al. | |

FOREIGN PATENT DOCUMENTS

| | | |
|---|---|---|
| CN | 1254948 A | 5/2000 |
| JP | 62-42127 A | 2/1987 |
| JP | 03-149525 A | 6/1991 |
| JP | 2000-122071 A | 4/2000 |
| JP | 2000-199917 A | 7/2000 |
| JP | 2000-284326 A | 10/2000 |
| JP | 2001-32981 A | 2/2001 |

(Continued)

*Primary Examiner* — David Vu
(74) *Attorney, Agent, or Firm* — Innovation Counsel LLP

(57) ABSTRACT

A method of manufacturing a thin film transistor array panel is provided, which includes: forming a gate line on a substrate; depositing a gate insulating layer and a semiconductor layer in sequence on the gate line; depositing a lower conductive film and an upper conductive film on the semiconductor layer; photo-etching the upper conductive film, the lower conductive film, and the semiconductor layer; depositing a passivation layer; photo-etching the passivation layer to expose first and second portions of the upper conductive film; removing the first and the second portions of the upper conductive film to expose first and second portions of the lower conductive film; forming a pixel electrode on the first portion of the lower conductive film; removing the second portion of the lower conductive film to expose a portion of the semiconductor layer; and forming a columnar spacer on the exposed portion of the semiconductor layer.

16 Claims, 18 Drawing Sheets

FOREIGN PATENT DOCUMENTS

| | | |
|---|---|---|
| JP | 2001-230321 A | 8/2001 |
| JP | 2001-267420 A | 9/2001 |
| JP | 2001-332740 A | 11/2001 |
| JP | 2002-214624 A | 7/2002 |
| JP | 2002-341355 A | 11/2002 |
| JP | 2003-084289 A | 3/2003 |
| KR | 10-2000-0038604 A | 7/2000 |
| KR | 1020020092719 A | 12/2002 |
| KR | 10-2003-0027302 A | 4/2003 |

* cited by examiner

THIN FILM TRANSISTOR ARRAY PANEL AND MANUFACTURING METHOD THEREOF

CROSS-REFERENCE TO RELATED APPLICATIONS

This application is a continuation of U.S. patent application Ser. No. 11/395,434, filed Mar. 30, 2006 now U.S. Pat. No. 7,358,123, by Jeong-Young Lee, Se-Hwan Yu, Sang-Jin jeon, and Min-Wook Park, entitled "THIN FILM TRANSISTOR ARRAY PANEL AND MANUFACTURING METHOD THEREOF;" which is a divisional of U.S. patent application Ser. No. 10/884,083, filed Jul. 1, 2004, now U.S. Pat. No. 7,023,016, which claims priority of Korean Patent Application No. 10-2003-0044581 filed Jul. 2, 2003; Korean Patent Application No. 10-2003-0055415 filed Aug. 11, 2003; and Korean Patent Application No. 10-2003-0055416 filed Aug. 11, 2003.

BACKGROUND OF THE INVENTION (a) Field of the Invention

The present invention relates to a thin film transistor array panel and a manufacturing method thereof.

(b) Description of the Related Art

A liquid crystal display (LCD) is one of the most widely used flat panel displays since it is lightweight and occupies less space than conventional cathode ray tube (CRT) displays. An LCD generally includes a liquid crystal (LC) layer that is interposed between a pair of panels including field-generating electrodes such as pixel electrodes and a common electrode. The LC layer is subjected to an electric field generated by the field-generating electrodes and variations in the field strength change the molecular orientation of the LC layer. For example, upon application of an electric field, the molecules of the LC layer change their orientation to change polarization of incident light. Appropriately arranged polarizers partially or fully block the light, creating gray or dark areas that can represent desired images.

One panel for the LCD generally includes a plurality of pixel electrodes, a plurality of thin film transistors (TFTs) for controlling signals to be applied to the pixel electrodes, a plurality of gate lines transmitting control signals for controlling the TFTs, and a plurality of data lines transmitting data voltages to be supplied to the pixel electrodes. The other panel generally includes a common electrode disposed on an entire surface thereof.

The TFT array panel including the TFTs includes several conductive films and insulting films. The gate lines, the data lines, and the pixel electrodes are formed of different films and they are separated by insulating films and sequentially arranged from bottom to top.

The TFT array panel is manufactured by several steps of film deposition and photolithography steps. Accordingly, it is important to obtain stable elements using a minimum process steps.

SUMMARY OF THE INVENTION

A motivation of the present invention is to solve the problems of the conventional art.

A method of manufacturing a thin film transistor array panel is provided, which includes: forming a gate line on a substrate; depositing a gate insulating layer and a semiconductor layer in sequence on the gate line; depositing a lower conductive film and an upper conductive film on the semiconductor layer; photo-etching the upper conductive film, the lower conductive film, and the semiconductor layer; depositing a passivation layer; photo-etching the passivation layer to expose first and second portions of the upper conductive film; removing the first and the second portions of the upper conductive film to expose first and second portions of the lower conductive film; forming a pixel electrode on the first portion of the lower conductive film; removing the second portion of the lower conductive film to expose a portion of the semiconductor layer; and forming a columnar spacer on the exposed portion of the semiconductor layer.

The photo-etching of the passivation layer may include: exposing the first portion of the upper conductive film and a portion of the gate insulating layer adjacent to the first portion. The exposed portion of the gate insulating layer may be covered with the pixel electrode along with the first portion of the lower conductive film.

The photo-etching of the passivation layer may further include: exposing a third portion of the upper conductive film. The removal of the first and the second portions of the upper conductive film may include: removing the third portion of the upper conductive film to expose a third portion of the lower conductive film.

The gate line may include a lower film and an upper film. The photo-etching of the passivation layer may further include: etching the gate insulating layer to expose a portion of the upper film of the gate line. The removal of the first and the second portions of the upper conductive film may include: removing the exposed portion of the upper film of the gate line to expose a portion of the lower film of the gate line.

The method may further include: forming a contact assistant on the third portion of the lower conductive film and the exposed portion of the lower film of the gate line.

The upper film of the gate line may include the same material as the upper conductive film. The upper film of the gate line and the upper conductive film may include Cr and the lower film of the gate line and the lower conductive film may include Al or Al—Nd alloy.

The semiconductor layer may include an intrinsic film and an extrinsic film, and the method may further include: removing the exposed portion of the extrinsic film after removing the second portion of the lower conductive film.

The method may further include: forming a protection member between the spacer and the exposed portion of the semiconductor layer. The formation of the protection member may include: depositing a silicon nitride film on the exposed portion of the semiconductor layer; and etching the silicon nitride film using the spacer as an etch mask to form the protection member.

A thin film transistor array panel is provided, which includes: a substrate; a gate line formed on the substrate and including lower and upper films; a gate insulating layer formed on the gate line; a semiconductor layer formed on the gate insulating layer; a plurality of ohmic contacts formed on the semiconductor layer; source and drain electrodes formed on the ohmic contacts and including lower and upper films; a passivation layer formed on the source and the drain electrodes and having a first contact hole exposing a portion of the drain electrode and a portion of the gate insulating layer adjacent thereto and an opening exposing a first portion of the semiconductor layer; a pixel electrode formed on the passivation layer and contacting the lower film of the drain electrode through the first contact hole; and a columnar spacer formed on the exposed portion of the exposed first portion of the semiconductor layer.

The opening may have at least an edge that coincides with an edge of the first portion of the semiconductor layer.

The upper film of the drain electrode may have has at least an edge that coincides with an edge of the first contact hole.

The lower film of the gate line has a first portion exposed out of the upper film of the gate line, the passivation layer may further have a second contact hole exposing the first portion of the lower film of the gate line, and the first portion of the lower film of the gate line may have an edge that coincide with an edge of the second contact hole.

The thin film transistor array panel may further include a contact assistant disposed on the first portion of the lower film of the gate line.

The upper film of the gate line and the upper conductive film may include Cr and the lower film of the gate line and the lower conductive film may include Al.

The thin film transistor array panel may further include a protection member disposed between and the spacer and the exposed first portion of the semiconductor layer.

A method of manufacturing a thin film transistor array panel is provided, which includes: forming a plurality of gate lines on a substrate; depositing a gate insulating layer and a semiconductor layer in sequence on the gate lines; depositing a lower conductive film and an upper conductive film on the semiconductor layer; photo-etching the upper conductive film, the lower conductive film, and the semiconductor layer; depositing a passivation layer; photo-etching the passivation layer to expose first and second portions of the upper conductive film; removing the first and the second portions of the upper conductive film to expose first and second portions of the lower conductive film; forming a plurality of pixel electrodes on the first portions of the lower conductive film; removing the second portions of the lower conductive film to expose portions of the semiconductor layer; and forming first and second columnar spacers on the exposed portions of the semiconductor layer, wherein the first columnar spacer is formed by using partial light exposure and the second spacer is formed by full light exposure.

A thin film transistor array panel is provided, which includes: a substrate; a plurality of gate lines formed on the substrate and including lower and upper films; a gate insulating layer formed on the gate lines; a semiconductor layer formed on the gate insulating layer; a plurality of ohmic contacts formed on the semiconductor layer; source and drain electrodes formed on the ohmic contacts and including lower and upper films; a passivation layer formed on the source and the drain electrodes and having a plurality of first contact holes exposing portions of the drain electrodes and portions of the gate insulating layer adjacent thereto and a plurality of openings exposing first portions of the semiconductor layer; a plurality of pixel electrodes formed on the passivation layer and contacting the lower films of the drain electrodes through the first contact holes; and first and second columnar spacers formed on the exposed first portions of the semiconductor layer and having different heights.

BRIEF DESCRIPTION OF THE DRAWINGS

The present invention will become more apparent by describing embodiments thereof in detail with reference to the accompanying drawings in which.

DETAILED DESCRIPTION OF EMBODIMENTS

Figure 1:
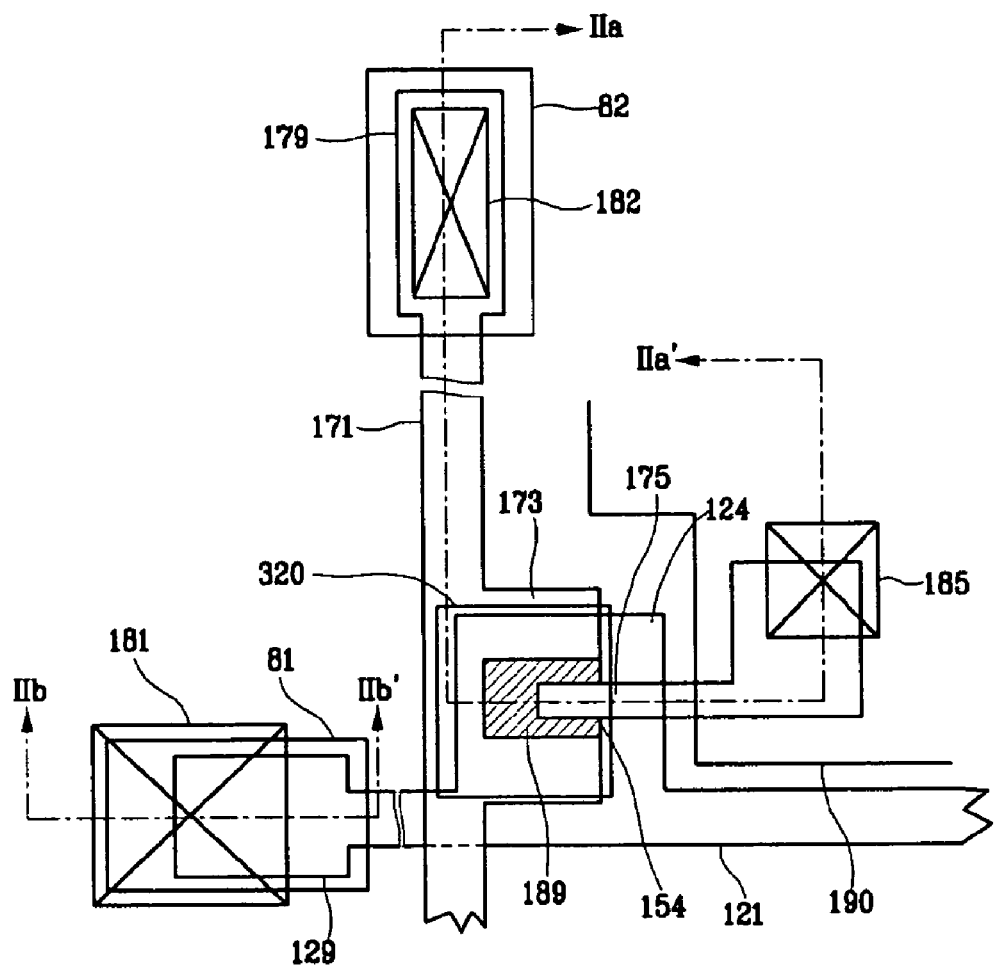
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD will be described in detail with reference to FIGS. 1, 2A and 2B.

Figure 2A:
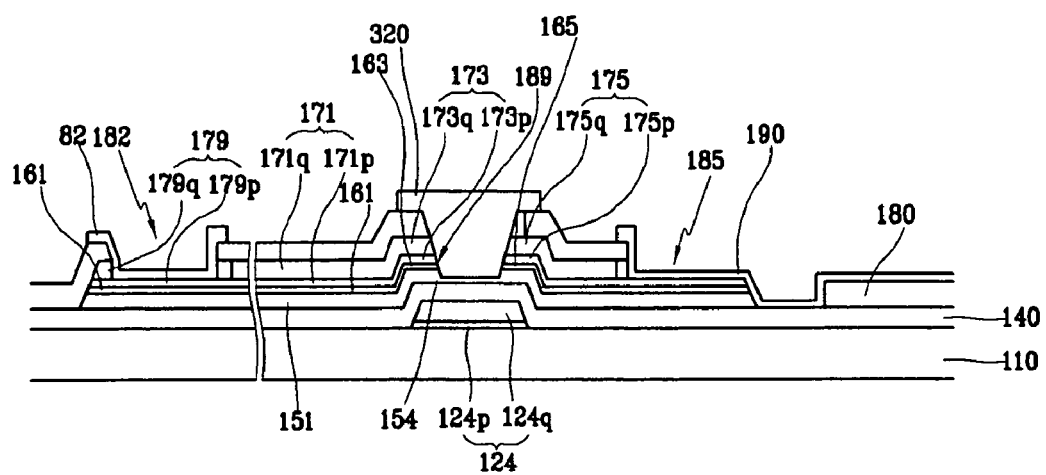
FIGS. 2A and 2B are sectional views of the TFT array panel shown in FIG. 1 taken along the lines IIa-IIa' and IIb-IIb', respectively.
Figure 2B:
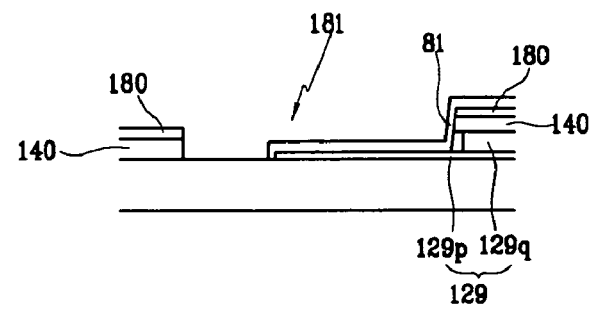

FIG. 1 is an exemplary layout view of a TFT array panel according to an embodiment of the present invention, and FIGS. 2A and 2B are sectional views of the TFT array panel shown in FIG. 1 taken along the lines IIa-IIa' and IIb-IIb', respectively.

A plurality of gate lines 121 for transmitting gate signals are formed on an insulating substrate 110. Each gate line 121 extends substantially in a transverse direction and it includes a plurality of portions projecting downward to form a plurality of gate electrodes 124 and an expanded end portion 129 having a large area for contact with another layer or an external device.

The gate lines 121 include two films having different physical characteristics, a lower film and an upper film. The upper film is preferably made of low resistivity metal including Al containing metal such as Al and Al alloy for reducing signal delay or voltage drop in the gate lines 121. On the other hand, the lower film is preferably made of material such as Cr, Mo, Mo alloy such as MoW, Ta and Ti, which has good physical, chemical, and electrical contact characteristics with other materials such as indium tin oxide (ITO) and indium zinc oxide (IZO). Good examples of combination of the lower film material and the upper film material are Cr and Al and Cr and Al—Nd alloy, which are etched under different etch conditions. In FIGS. 2A and 2B, the lower and the upper films of the gate electrodes 124 are indicated by reference numerals 124p and 124q, respectively, and the lower and the upper films of the end portions 129 are indicated by reference numerals 129p and 129q, respectively. Portions of the upper film 129q of the end portions 129 of the gate lines 121 are removed to expose the underlying portions of the lower films 129p and thus there is at least an edge of the upper film 129q disposed on the lower film 129p.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range between about 30-80 degrees.

A plurality of data lines 171 and a plurality of drain electrodes 175 are formed on the ohmic contacts 161 and 165.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each drain electrode 175 includes one end portion disposed on a gate electrode 124 and having a large area for contact with another layer and the other end portion partially enclosed by a source electrode 173. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 also include a lower film 171p and 175p and an upper film 171q and 175q located thereon. Good examples of combination of the lower film material and the upper film material are Cr and Al and Cr and Al—Nd alloy, which are etched under different etch conditions. In FIGS. 2A and 2B, the lower and the upper films of the source electrodes 173 are indicated by reference numerals 173p and 173q, respectively, and the lower and the upper films of the end portions 179 are indicated by reference numerals 179p and 179q, respectively. Portions of the upper film 175q/179q are removed to expose the underlying portions of the lower film 175p/179p and thus there is at least an edge of the upper film 175q/179q disposed on the lower film 175p/179p.

Like the gate lines 121, the data lines 171 and the drain electrodes 175 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and exposed portions of the semiconductor stripes 151, which are not covered with the data lines 171 and the drain electrodes 175. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 182 and 185 exposing the end portions 179 of the data lines 171 and the drain electrodes 175, respectively. The passivation layer 180 and the gate insulating layer 140 have a plurality of contact holes 181 exposing the end portions 129 of the gate lines 121. Furthermore, the passivation layer 180 has a plurality of openings 189 exposing the exposed portions of the projections 154 of the semiconductor stripes 151 in the TFTs. The boundary of the exposed portions of the projections 154 substantially coincide with the boundary of the openings 189.

The contact holes 181, 182 and 185 expose the lower films 129p, 179p and 175p. The edges of the upper films 129q, 179q and 175q disposed on the lower films 129p, 179p and 175p substantially coincide with boundaries of the contact holes 181, 182 and 185 or are covered with the gate insulating layer 140 and the passivation layer 180. In addition, the contact holes 181 expose edges of the end portions 129 of the gate lines 121 and some portions of the substrate 110, and the contact holes 185 expose edges of the drain electrodes 175 and some portions of the gate insulating layer 140.

A plurality of pixel electrodes 190 and a plurality of contact assistants 81 and 82, which are preferably made of ITO or IZO, are formed on the passivation layer 180.

The pixel electrodes 190 are physically and electrically connected to the drain electrodes 175 through the contact holes 185 such that the pixel electrodes 190 receive the data voltages from the drain electrodes 175. The pixel electrodes 190 fully cover the exposed portions of the drain electrodes 175.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, may be provided for enhancing the voltage storing capacity. The storage capacitors are implemented by overlapping the pixel electrodes 190 with the gate lines 121 adjacent thereto (called "previous gate lines") or with separately provided storage electrodes (not shown). The capacitances of the storage capacitors, i.e., the storage capacitances are increased by increasing overlapping areas or by providing conductors, which are connected to the pixel electrodes 190 and overlap the gate lines 121 or the storage electrodes, under the pixel electrodes 190 for decreasing the distance between the terminals.

The pixel electrodes 190 may overlap the gate lines 121 and the data lines 171 to increase aperture ratio.

The contact assistants 81/82 are connected to the exposed expansions 129/179 of the gate lines 121/the data lines 171 through the contact holes 181/182 and the contact holes 81 and 82 fully cover the exposed expansions 129 and 179. The contact assistants 81 and 82 protect the exposed portions 129 and 179 and complement the adhesion between the exposed portions 129 and 179 and external devices.

In the meantime, the exposure of the edges of the lower films 129p and 175p of the end portions 129 of the gate lines 121 and the drain electrodes 175 through the contact holes 181 and 185 prevents the disconnection of the contact assistants 81 and the pixel electrodes 190 at the contact holes 181 and 185. For example, portions of the pixel electrodes 190 near an edge of the contact hole 185 disposed on the lower film 175p may be disconnected due to the undercut of the upper film 175q at the edge of the contact hole 185. The undercut means that a portion of the upper film 175q under the passivation layer 180 at the edge of the contact hole 185 is removed to place the boundary of the upper film 175q under the passivation layer 180 such that the sidewall of the contact hole 185 has a hole or a depression as shown in FIG. 2A. However, the other edge of the contact hole 185 disposed directly on the gate insulating layer 140 does not have such undercut. Accordingly, the pixel electrodes 190 contact the drain electrodes 175 with a smooth profile, thereby securing the reliable contact therebetween.

A plurality of columnar spacers 320 preferably made of photosensitive organic material stand on the exposed portions of the semiconductor stripes 151 and on the passivation layer 180. The spacers 320 sustain a gap between the TFT array panel and the common electrode panel and protect the exposed portions of the semiconductor stripes 151.

According to another embodiment of the present invention, the pixel electrodes 190 are made of transparent conductive polymer. For a reflective LCD, the pixel electrodes 190 are made of opaque reflective metal. In these cases, the contact assistants 81 and 82 may be made of material such as ITO or IZO different from the pixel electrodes 190.

A method of manufacturing the TFT array panel shown in FIGS. 1, 2A and 2B according to an embodiment of the present invention will be now described in detail with reference to FIGS. 3 to 12B as well as FIGS. 1, 2A and 2B.

Figure 3:
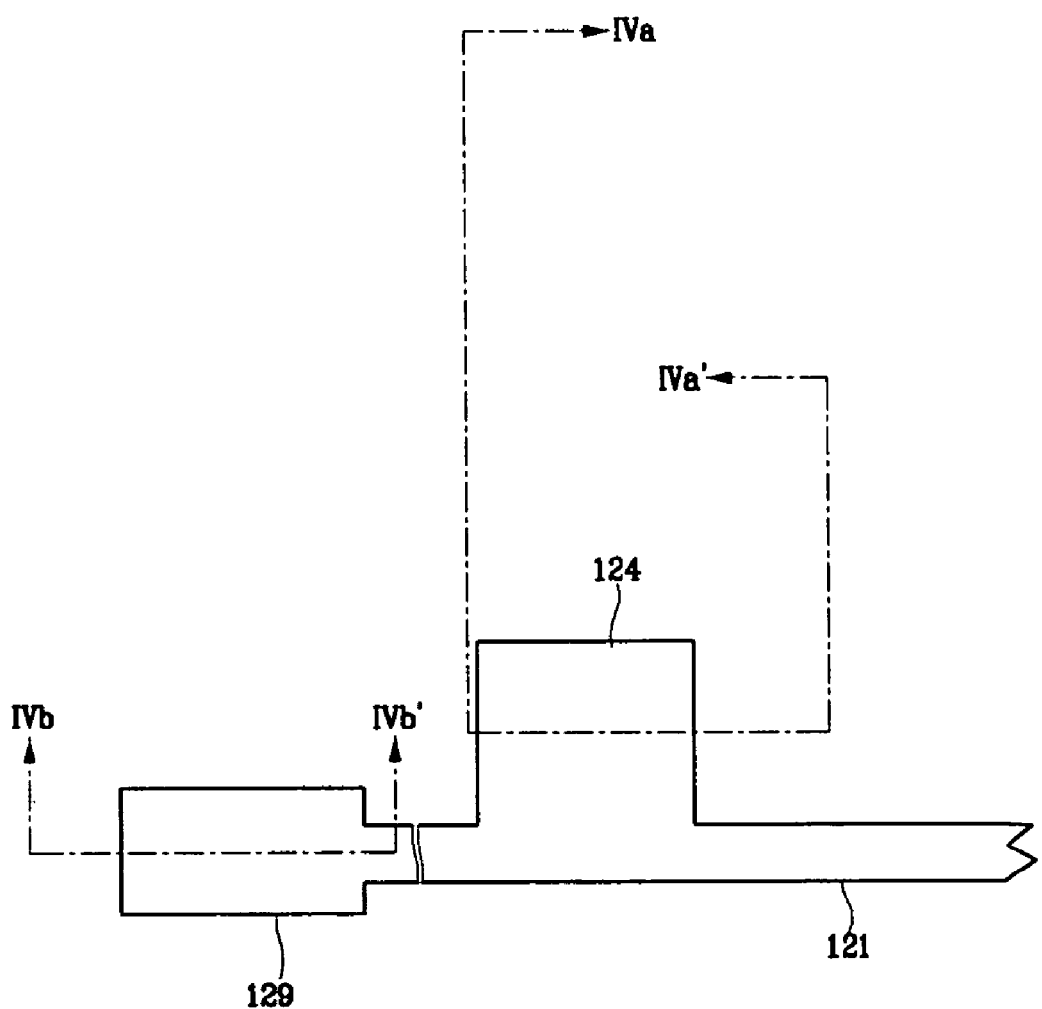
FIG. 3 is a layout view of a TFT array panel shown in FIGS. 1, 2A and 2B in the first step of a manufacturing method thereof according to an embodiment of the present invention.
Figure 4A:
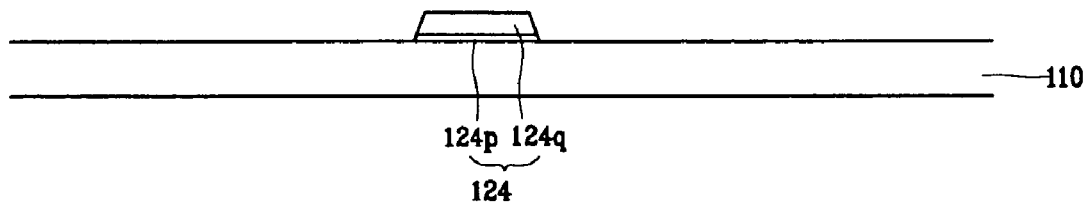
FIGS. 4A and 4B are sectional views of the TFT array panel shown in FIG. 3 taken along the lines IVa-IVa' and IVb-IVb', respectively.
Figure 4B:
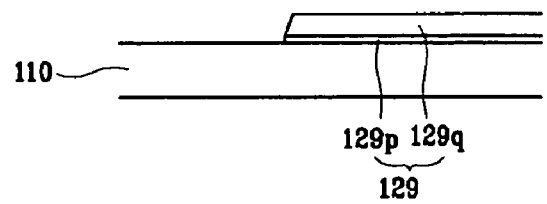
Figure 5:
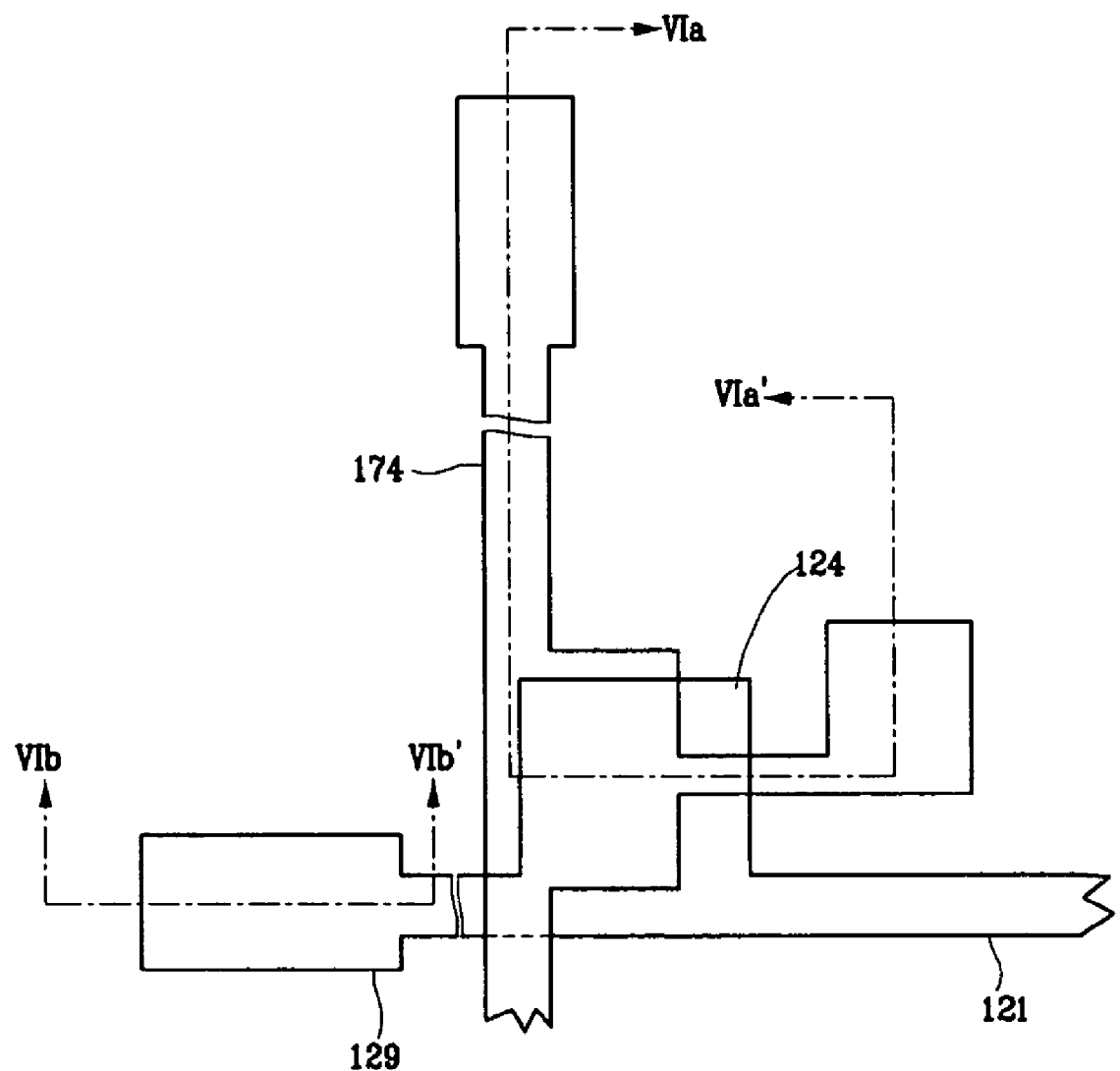
FIG. 5 is a layout view of the TFT array panel in the step following the step shown in FIGS. 3-4B.
Figure 6A:
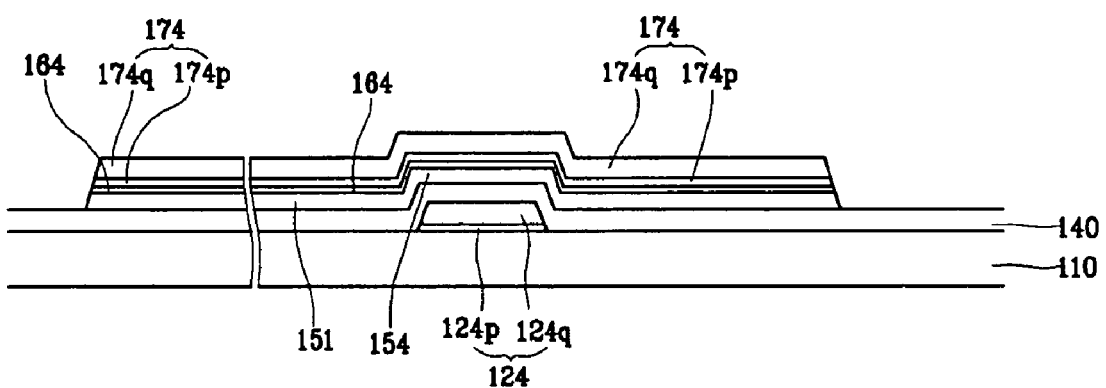
FIGS. 6A and 6B are sectional views of the TFT array panel shown in FIG. 5 taken along the lines VIa-VIa' and VIb-VIb', respectively.
Figure 6B:
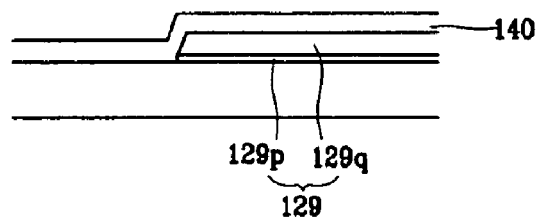
Figure 7:
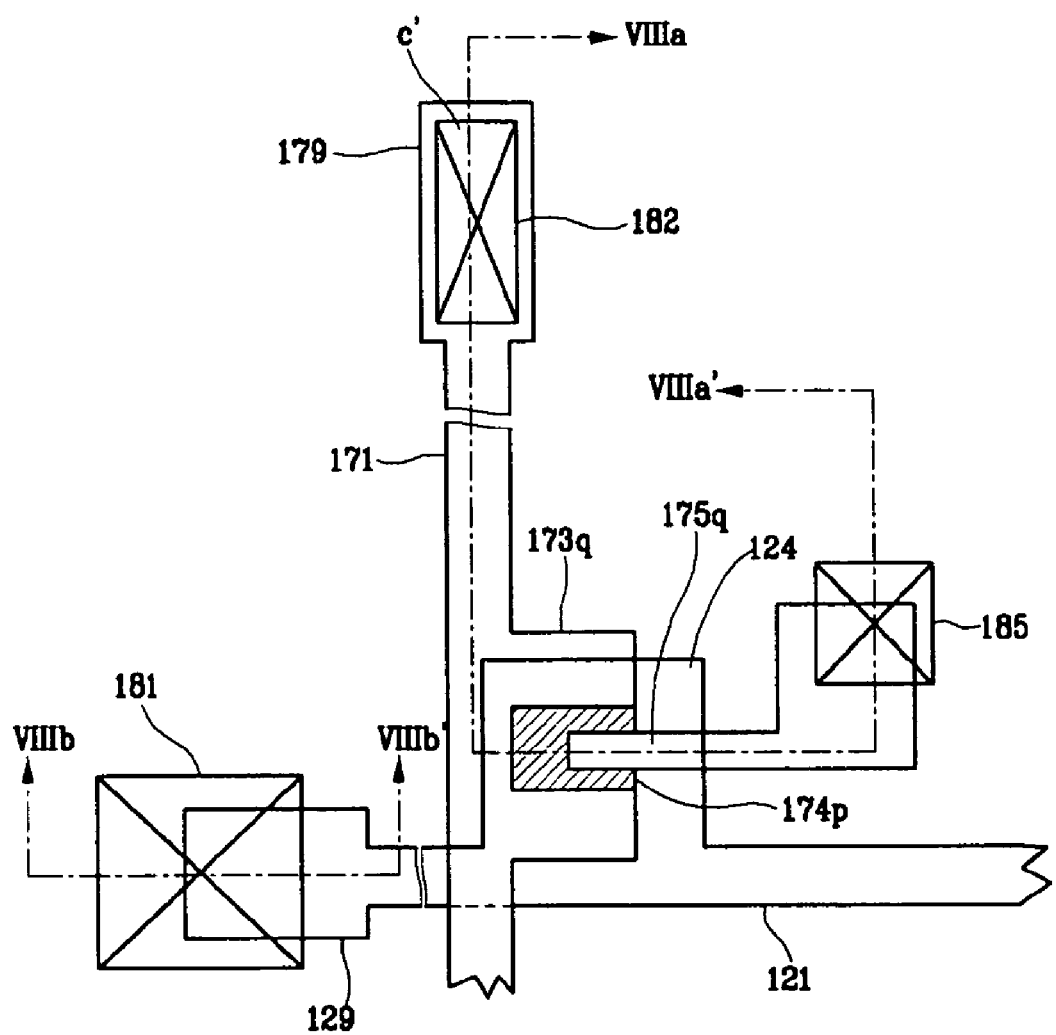
FIG. 7 is a layout view of the TFT array panel in the step following the step shown in FIGS. 5-6B.
Figure 8A:
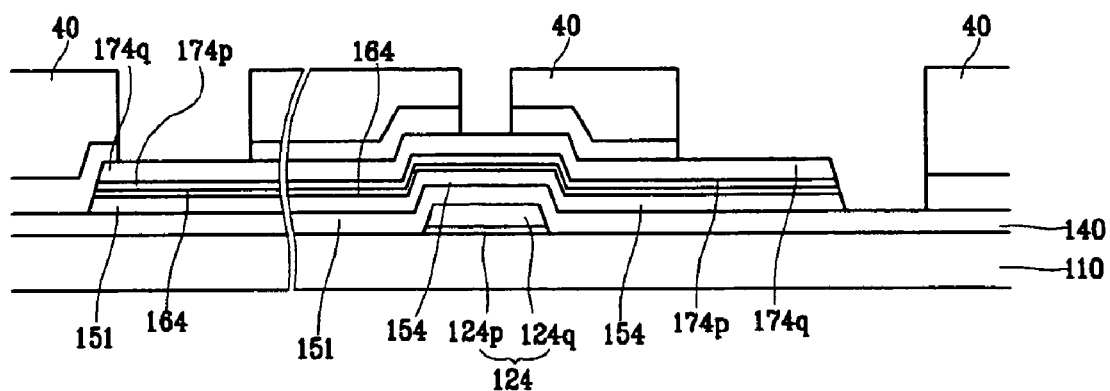
FIGS. 8A and 8B are sectional views of the TFT array panel shown in FIG. 7 taken along the lines VIIIa-VIIIa' and VIIIb-VIIIb', respectively.
Figure 8B:
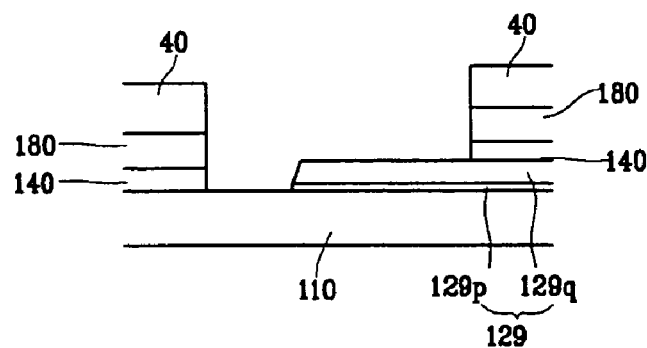
Figure 9A:
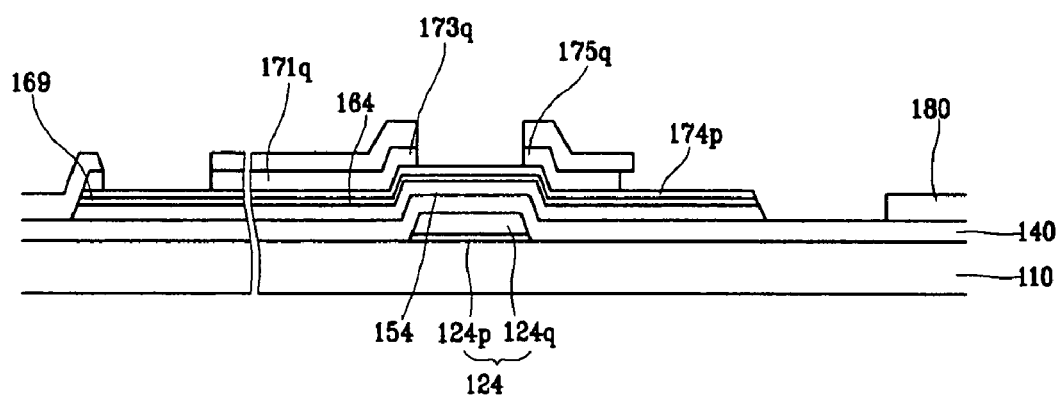
FIGS. 9A and 9B are sectional views of the TFT array panel shown in FIG. 7 taken along the lines VIIIa-VIIIa' and VIIIb-VIIIb', respectively, and illustrate the step following the step shown in FIGS. 8A and 8B.
Figure 9B:
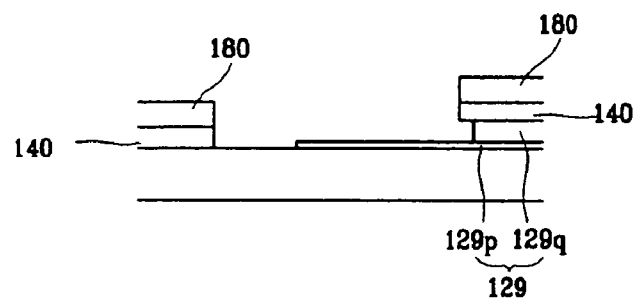
Figure 10:
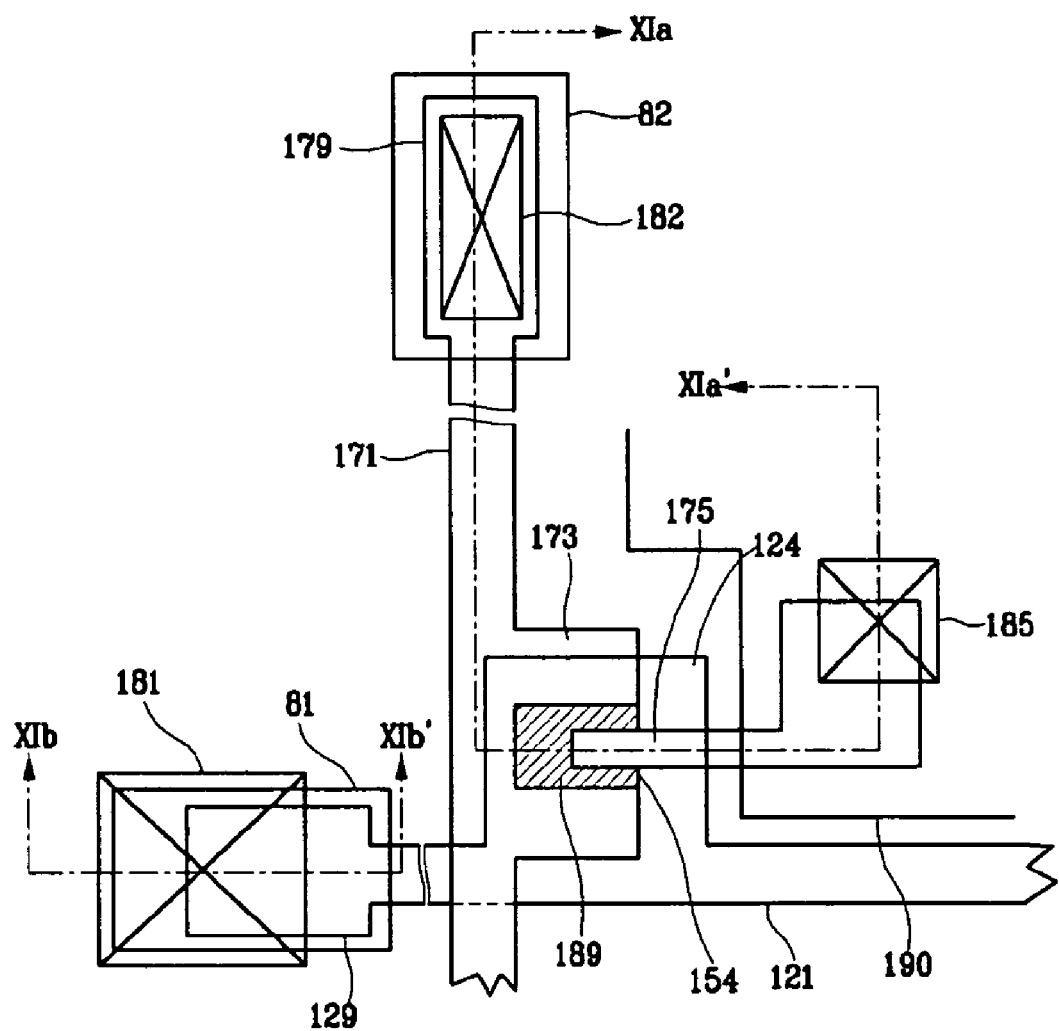
FIG. 10 is a layout view of the TFT array panel in the step following the step shown in FIGS. 9A and 9B.
Figure 11A:
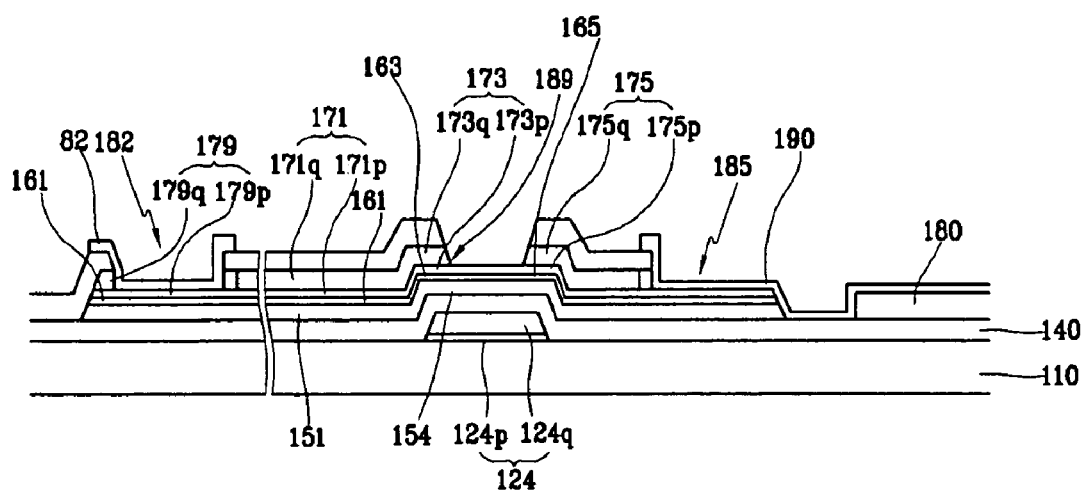
FIGS. 11A and 11B are sectional views of the TFT array panel shown in FIG. 10 taken along the lines XIa-XIa' and XIb-XIb', respectively.
Figure 11B:
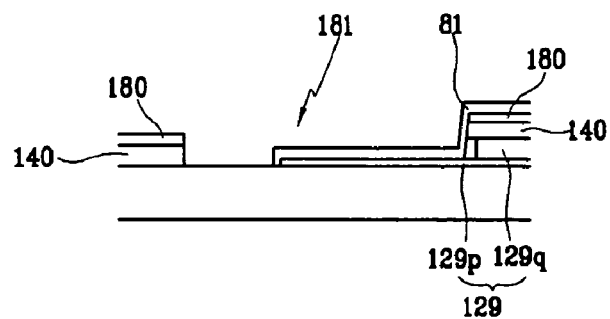
Figure 12A:
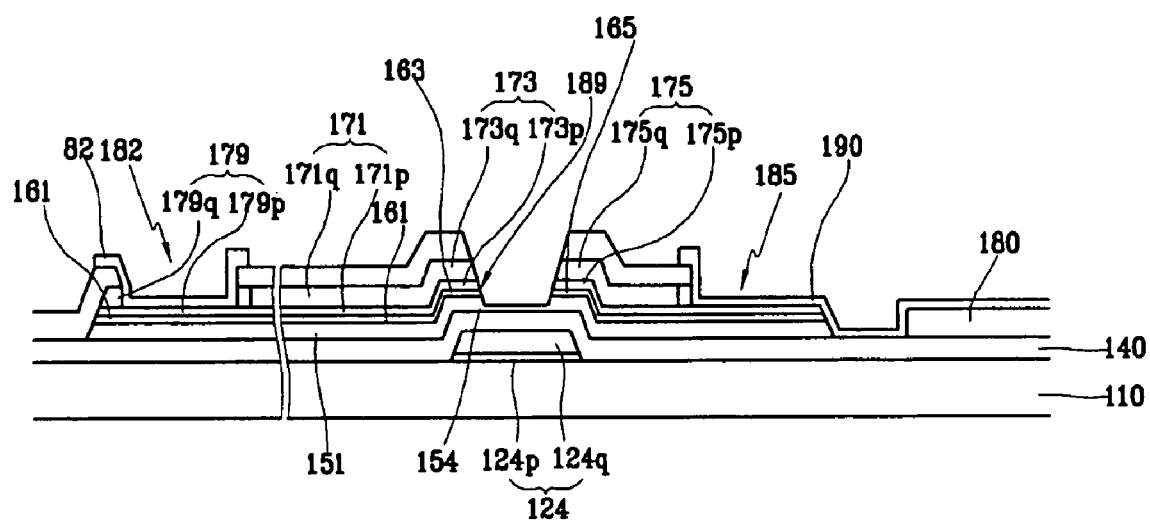
FIGS. 12A and 12B are sectional views of the TFT array panel shown in FIG. 10 taken along the lines XIa-XIa' and XIb-XIb', respectively, and illustrate the step following the step shown in FIGS. 11A and 11B.
Figure 12B:
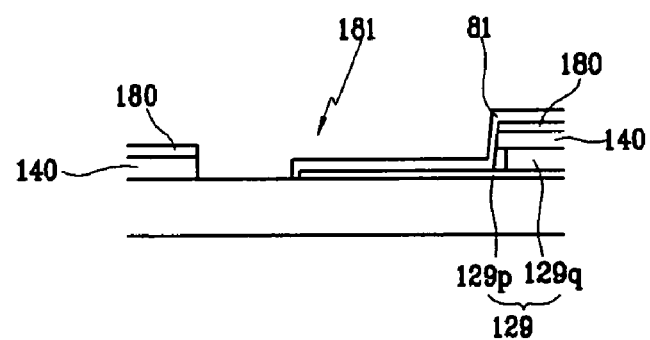

FIG. 3 is a layout view of a TFT array panel shown in FIGS. 1, 2A and 2B in the first step of a manufacturing method thereof according to an embodiment of the present invention; FIGS. 4A and 4B are sectional views of the TFT array panel shown in FIG. 3 taken along the lines IVa-IVa' and IVb-IVb', respectively; FIG. 5 is a layout view of the TFT array panel in the step following the step shown in FIGS. 3-4B; FIGS. 6A and 6B are sectional views of the TFT array panel shown in FIG. 5 taken along the lines VIa-VIa' and VIb-VIb', respectively; FIG. 7 is a layout view of the TFT array panel in the step following the step shown in FIGS. 5-6B; FIGS. 8A and 8B are sectional views of the TFT array panel shown in FIG. 7 taken along the lines VIIIa-VIIIa' and VIIIb-VIIIb', respectively; FIGS. 9A and 9B are sectional views of the TFT array panel shown in FIG. 7 taken along the lines VIIIa-VIIIa' and VIIIb-VIIIb', respectively, and illustrate the step following the step shown in FIGS. 8A and 8B; FIG. 10 is a layout view of the TFT array panel in the step following the step shown in FIGS. 9A and 9B; FIGS. 11A and 11B are sectional views of the TFT array panel shown in FIG. 10 taken along the lines XIa-XIa' and XIb-XIb', respectively; and FIGS. 12A and 12B are sectional views of the TFT array panel shown in FIG. 10 taken along the lines XIa-XIa' and XIb-XIb', respectively, and illustrate the step following the step shown in FIGS. 11A and 11B.

Referring to FIGS. 3-4B, a plurality of gate lines 121 including a plurality of gate electrodes 124 are formed on an insulating substrate 110 such as transparent glass. The gate lines 121 include two conductive films, a lower conductive film preferably made of Cr and having a thickness of about 500 Å and an upper conductive film preferably made of Al and having a thickness of about 1,000-3,000 Å, preferably about 2,500 Å.

Referring to FIGS. 5-6B, a gate insulating layer 140, an intrinsic a-Si layer, an extrinsic a-Si layer, and a conductive layer including a lower conductive film and an upper conductive film are deposited in sequence by CVD and sputtering and the conductive layer, the extrinsic a-Si layer, and the intrinsic a-Si layer are photo-etched to form a plurality of conductors 174 including upper and lower conductors 174q and 174p, a plurality of extrinsic semiconductor stripes 164, and a plurality of intrinsic semiconductor stripes 151 including a plurality of projections 154 on the gate insulating layer 140.

The gate insulating layer 140 is preferably made of silicon nitride with thickness of about 2,000 Å to about 5,000 Å, and the deposition temperature is preferably in a range between about 250° C. and about 500° C. The intrinsic a-Si layer and the extrinsic a-Si layer have thickness of about 500-600 Å. The lower conductive film preferably made of Cr and having a thickness of about 500 Å and the upper conductive film preferably made of Al and having a thickness of about 1,000-3,000 Å, preferably about 2,500 Å. A sputtering target for the upper conductive film is preferably Al or Al—Nd containing about 2 atomic % of Nd and a sputtering temperature is about 150° C.

Referring to FIGS. 7-9B, a passivation layer 180 preferably having a thickness larger than about 3,000 Å is deposited and a photoresist 40 is formed. The passivation layer 180 and the gate insulating layer 140 are etched using the photoresist 40 as an etch mask to form a plurality of contact holes 181, 182 and 185 and a plurality of openings 189.

In detail, the photoresist 40 initially has a position dependent thickness such that portions (not shown) on the contact holes 185 have smaller thickness than other portions, and there is substantially no photoresist on the contact holes 181 and 182 and the openings 189. Portions of the passivation layer 180 and the gate insulating layer 140, which are not covered with the photoresist 40, are removed to form the contact holes 181 and 182 exposing the upper film 129$q$ of the end portions 129 of the gate lines 121 and the upper conductors 174$q$. Thereafter, portions of the photoresist 40 on the contact holes 185 are removed to expose underlying portions of the passivation layer 180 and the exposed portions of the passivation layer 180 are removed to form the contact holes 185 as shown in FIGS. 8A and 8B. After or before removing the photoresist 40, the exposed portions of the upper conductors 174$q$ and the upper film 129$q$ are removed to expose the lower conductors 174$p$ and the lower film 129$p$ and to complete the upper films 171$q$ and 175$q$ of the end portions 179 and the drain electrodes 175 as shown in FIGS. 9A and 9B. The etch condition for etching the upper conductors 174$q$ and the upper film 129$q$ is determined so that the lower conductors 174$p$ and the lower film 129$p$ may not be etched. At this time, the undercut of the upper conductors 174$q$ and the upper film 129$q$ may be formed as shown in FIGS. 9A and 9B.

Referring to FIGS. 10-11B, an ITO or IZO layer having a thickness of about 400-500 Å is sputtered and photo-etched to form a plurality of pixel electrodes 190 and a plurality of contact assistants 81 and 82. An example of commercially available sputtering target for IZO is IDIXO (indium x-metal oxide) produced by Idemitsu in Japan. The sputtering target may include $In_2O_3$ and ZnO and the content of Zn among In and Zn preferably ranges about 15-20 atomic %. In addition, the sputtering temperature for Zn is preferably lower than about 250° C. and IZO can be etched by oxalic acid.

The contact assistants 81 and 82 and the pixel electrodes 190 cover the exposed portions of the lower films 129$p$, the lower conductors 174$p$, and the gate insulating layer 140 exposed through the contact holes 181, 182 and 185. However, the exposed portions of the lower conductors 174$p$ exposed through the contact holes 189 are not covered yet.

Referring to FIGS. 12A and 12B, the exposed portions of the lower conductors 174$p$ are removed by blanket etch to expose the extrinsic semiconductor stripes 164 and to complete the lower films 171$p$ and 175$p$ of the data lines 171 and the drain electrodes 175. Subsequently, the exposed portions of the extrinsic semiconductor stripes 164, which are not covered with the data lines 171 and the drain electrodes 175, are removed by blanket etch to complete a plurality of ohmic contact stripes 161 including a plurality of projections 163 and a plurality of ohmic contact islands 165 and to expose portions of the intrinsic semiconductor stripes 151.

Oxygen plasma treatment may follow thereafter in order to stabilize the exposed surfaces of the semiconductor stripes 151.

Finally, a plurality of columnar spacers 320 are formed on the exposed portions of the semiconductor stripes 151 as shown in FIGS. 1-2B. The columnar spacers 320 may be made of photosensitive material and this can simplify the process since the thickness of the photosensitive film can be adjusted by controlling rotational speed of a spin coating device.

The above-describe method separates the source electrodes 173 and the drain electrodes 175 using the passivation layer 180, the contact assistants 81 and 82, and the pixel electrodes 190, thereby reducing the number of photolithography steps. Accordingly, the manufacturing method is simplified to reduce the production cost and the productivity.

In the meantime, the spacers 320 may include those shorter than others since the spacers 320 may obstruct the injection of the liquid crystal performed after or before assembling the TFT array panel and the common electrode panel. In this case, the shorter spacers do not serve as a gap sustainer but only serve as a protector for the exposed channel portions of the semiconductor stripes 151 in the TFTs.

Figure 13:
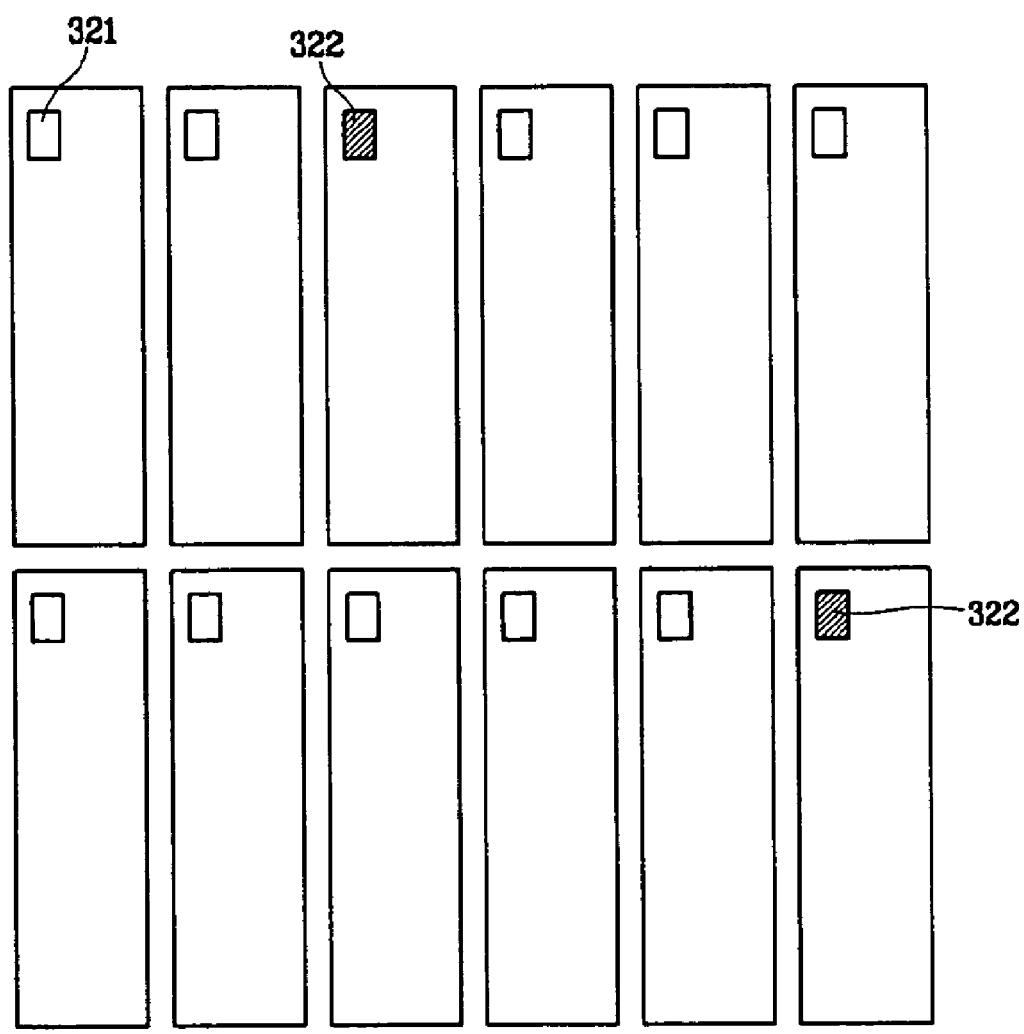
FIG. 13 shows an example of the arrangement of shorter spacers and taller spacers.

FIG. 13 shows an example of the arrangement of shorter spacers and taller spacers. Each rectangle shown in FIG. 13 represents a pixel area that is substantially enclosed by a pair of gate lines 121 and a pair of data lines 171.

As shown in FIG. 13, the concentration of the shorter spacers 321 for protecting the exposed channel portions of the TFTs is higher than that of the taller spacers 322 for protecting the exposed channel portions of the TFTs and for sustaining the gap between the panels. FIG. 13 shows that one taller spacer 322 is assigned to six pixel areas and the position of the taller spacers 322 alternates along a row direction. However, the concentration and the position of the taller spacers 322 and the shorter spacers 321 can be modified depending on the manufacturing conditions or the products. For example, one taller spacer 322 is assigned to nine of twelve pixel areas.

Now, a method of manufacturing columnar spacers having different heights will be described in detail with reference to FIGS. 14A and 14B.

Figure 14A:
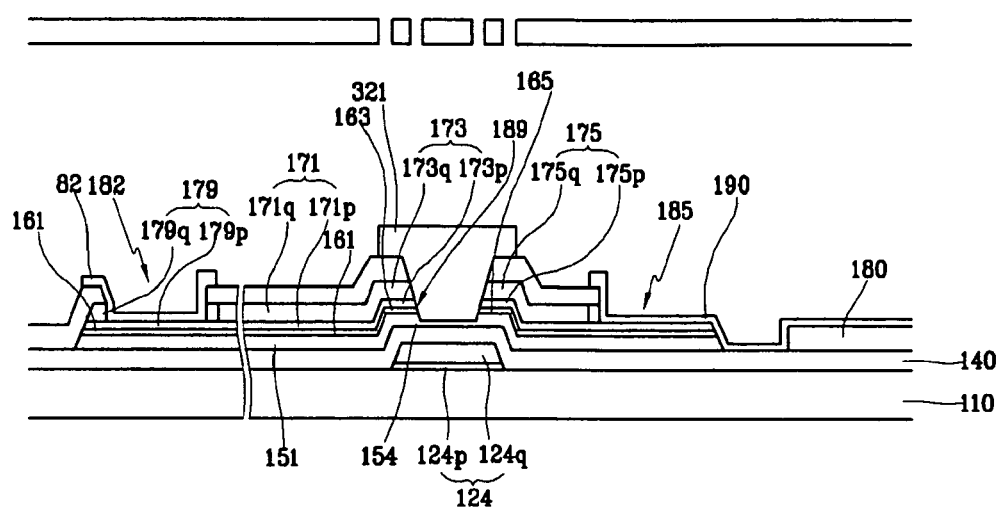
FIGS. 14A and 14B are sectional views of the TFT array panel showing a method of manufacturing columnar spacers having different heights.
Figure 14B:
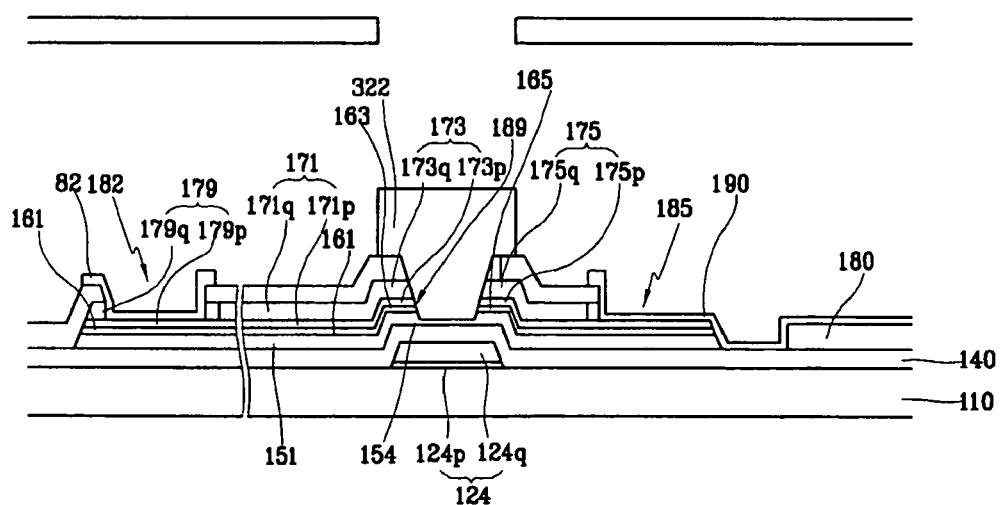

Referring to FIGS. 14A and 14B, a negative photosensitive film is formed on the substrate 110 and a mask having light transmitting areas, light blocking areas, and translucent areas are aligned with the substrate 110. The translucent areas include a plurality of slits as shown in FIG. 14A, and the light blocking areas are provided with opaque films as shown in FIGS. 14A and 14B. The slit areas face the shorter spacers 321 and the light transmitting areas face the taller spacers 322. However, when using a positive photosensitive film, the light blocking areas face the taller spacers 322. Subsequently, the negative photosensitive film is developed to form the spacers 321 and 322. The height of the taller spacers 322 may be adjusted depending on the desired cell gap by controlling the thickness of the photosensitive film.

A TFT array panel for an LCD according to another embodiment of the present invention will be described in detail with reference to FIGS. 15, 16A and 16B.

Figure 15:
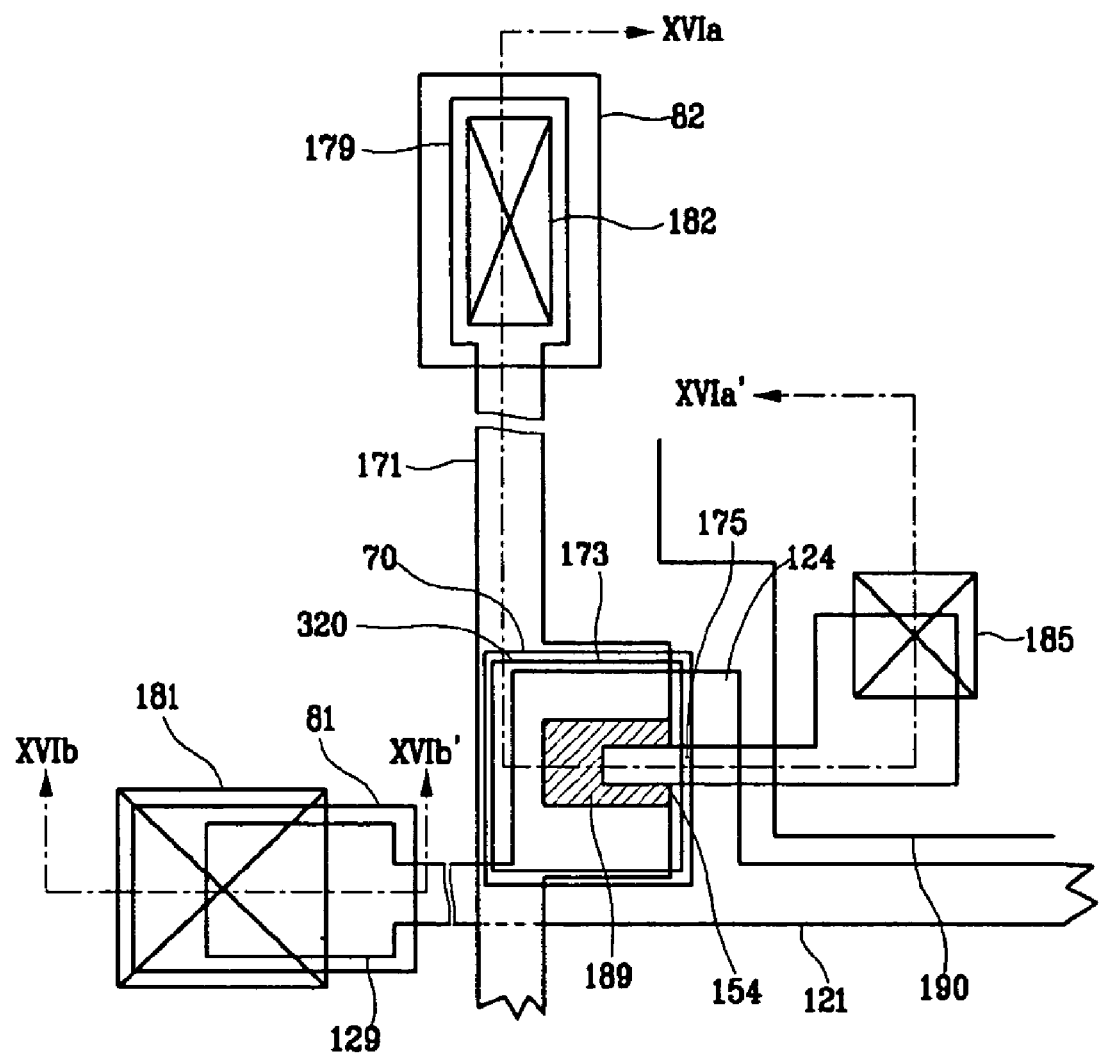
FIG. 15 is a layout view of a TFT array panel for an LCD according to another embodiment of the present invention.
Figure 16A:
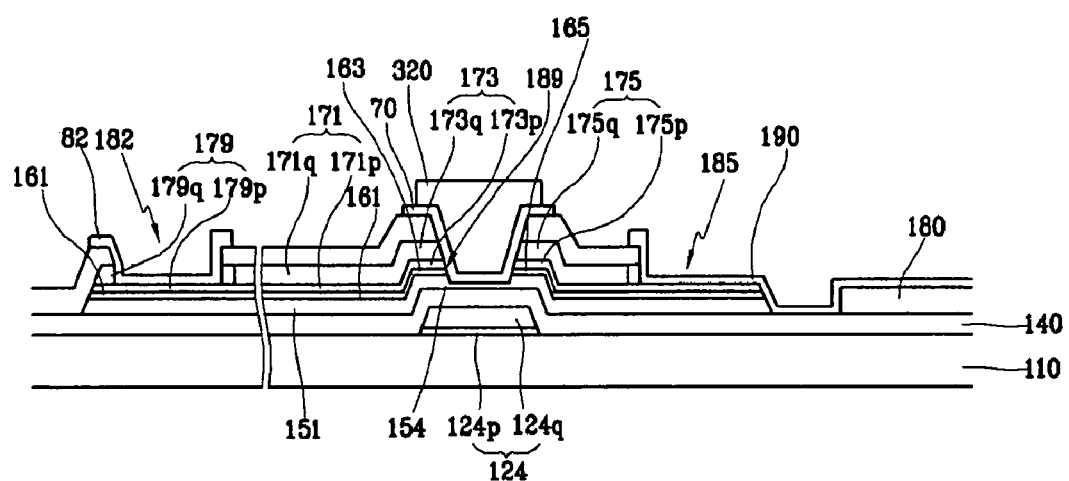
FIGS. 16A and 16B are sectional views of the TFT array panel shown in FIG. 15 taken along the lines XVIa-XVIa' and XVIb-XVIb', respectively.
Figure 16B:
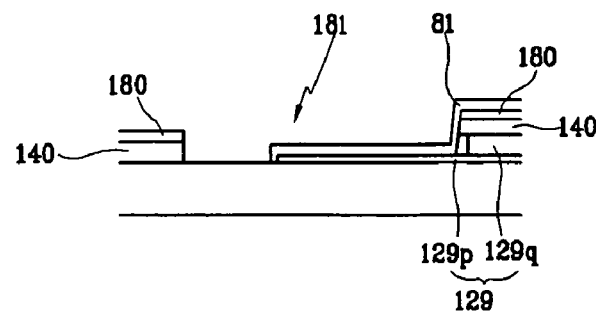

FIG. 15 is a layout view of a TFT array panel for an LCD according to another embodiment of the present invention, FIG. 16A is a sectional view of the TFT array panel shown in FIG. 15 taken along the line XVIa-XVIa', and FIG. 16B is a sectional view of the TFT array panel shown in FIG. 15 taken along the lines XVIb-XVIb'.

Referring to FIGS. 15-16B, a layered structure of the TFT array panel according to this embodiment is almost the same as those shown in FIGS. 1-2B.

That is, a plurality of gate lines 121 including a plurality of gate electrodes 124 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 preferably made of photosensitive organic material are formed thereon. A plurality of contact holes 181, 182 and 185 and a plurality of openings 189 are provided at the passivation layer 180 and the gate insulating layer 140, and a plurality of pixel electrodes 190 and a plurality of contact assistants 81 and 82 are formed on the passivation layer 180. A plurality of columnar spacers 320 are formed on the openings 189.

Different from the TFT array panel shown in FIGS. 1-2B, the TFT array panel according to this embodiment provides a plurality of protection members 70 preferably made of silicon nitride under the spacers 320.

The protection members 70 improve poor contact and poor adhesion between semiconductor and organic material at the openings 189. Since the poor contact between the semiconductor and the organic material yields the variation of a threshold voltage of a TFT, the protection layer 70 also prevents the threshold voltage variation.

Many of the above-described features of the TFT array panel for an LCD shown in FIGS. 1-2B may be appropriate to the TFT array panel shown in FIGS. 15-16B.

Now, a method of manufacturing the TFT array panel shown in FIGS. 15-16B will be described in detail with reference to FIGS. 17A-18B as well as FIGS. 15-16B and FIGS. 3-12B.

Figure 17A:
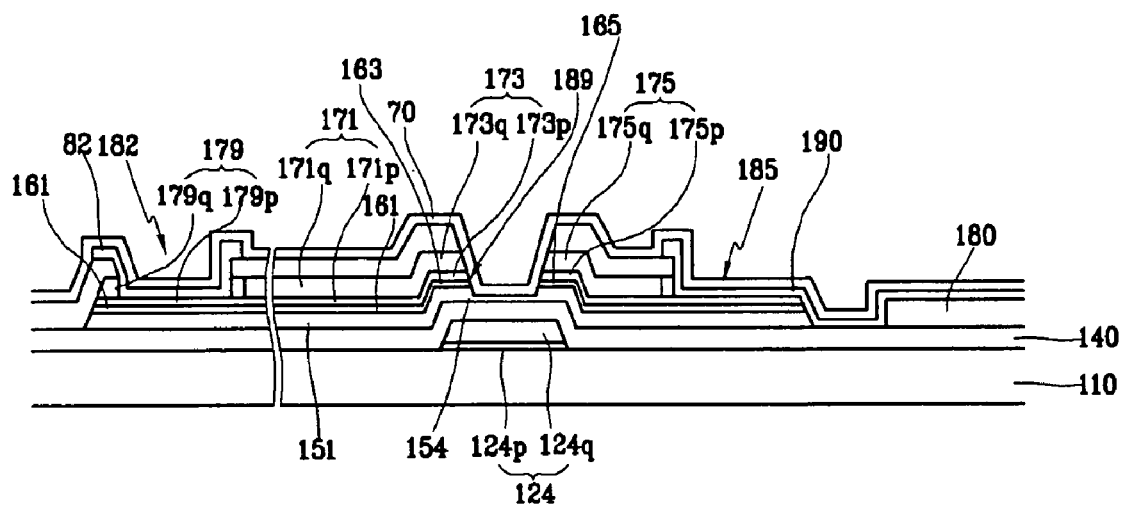
FIGS. 17A and 17B are sectional view of the TFT array panel shown in FIGS. 15-16B taken along the lines XVIa-XVIa' and XVIb-XVIb', respectively, in an intermediate step of a manufacturing method thereof according to an embodiment of the present invention.
Figure 17B:
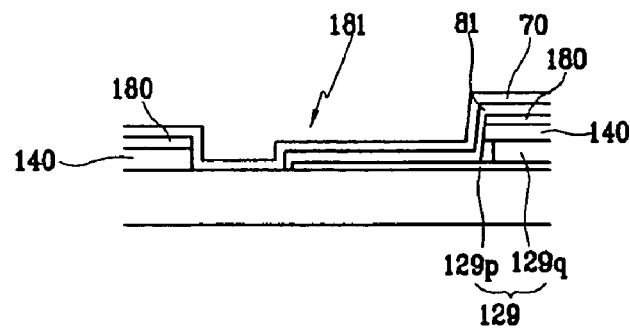
Figure 18A:
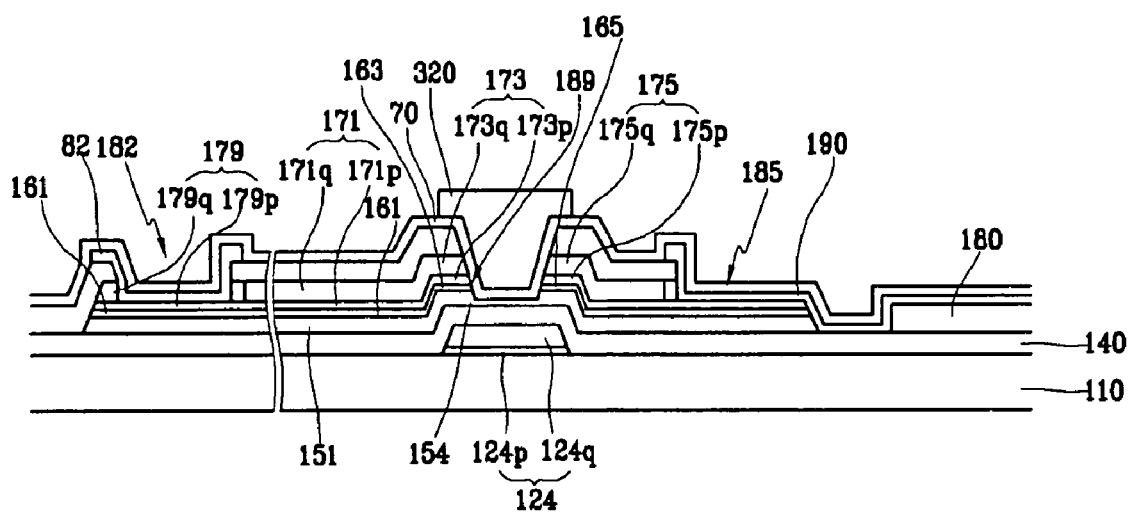
FIGS. 18A and 18B are sectional views of the TFT array panel in the step following the step shown in FIGS. 17A and 17B.
Figure 18B:
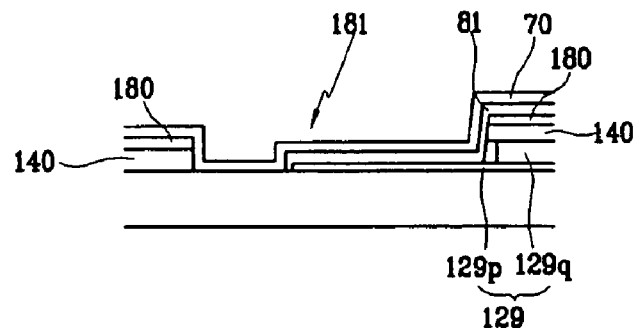

FIGS. 17A and 17B are sectional view of the TFT array panel shown in FIGS. 15-16B taken along the lines XVIa-XVIa' and XVIb-XVIb', respectively, in an intermediate step of a manufacturing method thereof according to an embodiment of the present invention; and FIGS. 18A and 18B are sectional views of the TFT array panel in the step following the step shown in FIGS. 17A and 17B.

Referring to FIGS. 3-12B, a plurality of gate lines 121 including a plurality of gate electrodes 124, a gate insulating layer 140, a plurality of semiconductor stripes 151 including a plurality of projections 154, a plurality of ohmic contact stripes 161 including a plurality of projections 163 and a plurality of ohmic contact islands 165, a plurality of data lines 171 including a plurality of source electrodes 173 and a plurality of drain electrodes 175, a passivation layer 180 having a plurality of contact holes 181, 182 and 185 and a plurality of openings 189 along with the gate insulating layer 140, and a plurality of pixel electrodes 190 and a plurality of contact assistants 81 and 82 are formed on a substrate 110.

Referring to FIGS. 17A and 17B, a silicon nitride layer 70 is deposited on an entire surface of the substrate 110.

Referring to FIGS. 18A and 18B, a photosensitive film is coated on the silicon nitride layer 70 and subjected to light exposure and development to form a plurality of columnar spacers 320.

Finally, the silicon nitride film 70 is etched using the spacers 320 as an etch mask to form a plurality of protection members 70.

As described above, the embodiments of the present invention reduce the number of the photolithography steps by separating the source electrodes and the drain electrodes using the passivation layer, the contact assistants, and the pixel electrodes. Accordingly, the manufacturing method is simplified to reduce the production cost and the productivity.

In addition, the embodiments prevent the disconnection of the pixel electrodes and the contact assistants by making the contact holes expose edges of the drain electrodes and the gate lines.

Furthermore, the embodiments facilitate the injection of the liquid crystal by shortening some of the columnar spacers and prevent the variation of the TFTs by providing the protection members between the organic passivation layer and the semiconductors.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   a substrate;
   a gate line disposed on the substrate;
   a first insulating layer disposed on the gate line;
   a semiconductor member disposed on the first insulating layer;
   a plurality of ohmic contacts disposed on the semiconductor member;
   a source electrode and a drain electrode disposed on the ohmic contacts, each of the source electrode and the drain electrode comprising a first film and a second film disposed on the first film;
   a second insulating layer that is disposed on the source electrode and the drain electrode and has a first contact hole exposing a portion of the drain electrode and a portion of the first insulating layer adjacent thereto and an opening exposing a portion of the semiconductor member;
   a pixel electrode disposed on the second insulating layer and contacting the first film of the drain electrode through the first contact hole; and
   a columnar spacer disposed on the exposed portion of the semiconductor member.

2. The thin film transistor array panel of claim 1, wherein the opening has at least an edge that coincides with an edge of the exposed portion of the semiconductor member.

3. The thin film transistor array panel of claim 2, wherein the at least an edge of the opening coincides with an edge of the source electrode, an edge of the drain electrode, and edges of the ohmic contacts.

4. The thin film transistor array panel of claim 3, wherein a planar shape of the ohmic contacts is substantially the same as a planar shape of the source electrode and the drain electrode.

5. The thin film transistor array panel of claim 4, wherein a planar shape of the semiconductor member except for the exposed portion is substantially the same as a planar shape of the source electrode and the drain electrode.

6. The thin film transistor array panel of claim 1, wherein the first film of the drain electrode has at least an edge that coincides with an edge of the first contact hole.

7. The thin film transistor array panel of claim 6, further comprising a data line connected to the source electrode and comprising a third film and a fourth film disposed on the third film,
   wherein the second insulating layer further has a second contact hole exposing a portion of the third film of the data line, and the third film of the data line has at least an edge that coincides with an edge of the second contact hole.

8. The thin film transistor array panel of claim 7, further comprising a contact assistant disposed on the exposed portion of the third film of the data line and comprising indium tin oxide or indium zinc oxide.

9. The thin film transistor array panel of claim 8, wherein the pixel electrode comprises indium tin oxide or indium zinc oxide, and wherein the fourth films of the data line, the source electrode, and the drain electrode comprise aluminum (Al).

10. The thin film transistor array panel of claim 9, wherein the third films of the data line, the source electrode, and the drain electrode comprise chromium (Cr).

11. The thin film transistor array panel of claim 1, wherein the gate line comprises a third film and a fourth film disposed on the third film, and the third film of the gate line comprises an uncovered portion disposed out of the fourth film of the gate line.

12. The thin film transistor array panel of claim 11, wherein the second insulating layer further has a second contact hole exposing the uncovered portion of the gate line, and the uncovered portion of the gate line has an edge that coincides with an edge of the second contact hole.

13. The thin film transistor array panel of claim 12, further comprising a contact assistant disposed on the uncovered portion of the gate line and comprising indium tin oxide or indium zinc oxide.

14. The thin film transistor array panel of claim 13, wherein the pixel electrode comprises indium tin oxide or indium zinc oxide, the third film of the gate line, the first film of the source electrode, and the first film of the drain electrode comprise chromium (Cr), and the fourth film of the gate line, the second film of the source electrode, and the second film of the drain electrode comprise aluminum (Al).

15. The thin film transistor array panel of claim 1, further comprising a protection member disposed between and the spacer and the exposed portion of the semiconductor member.

16. A thin film transistor array panel comprising:
a substrate;
a plurality of gate lines disposed on the substrate;
a first insulating layer disposed on the gate lines;
a semiconductor layer formed on the gate insulating layer;
a plurality of ohmic contacts formed on the semiconductor layer;
source and drain electrodes formed on the ohmic contacts, each of the source and drain electrodes comprising a first film and a second film disposed on the first film;
a second insulating layer disposed on the source and the drain electrodes and having a plurality of first contact holes exposing portions of the drain electrodes and portions of the gate insulating layer adjacent thereto and a plurality of openings exposing first portions of the semiconductor layer;
a plurality of pixel electrodes formed on the second insulating layer and contacting the first films of the drain electrodes through the first contact holes; and
first and second columnar spacers formed on the exposed first portions of the semiconductor layer and having different heights.

\* \* \* \* \*